United States Patent [19]

Tani et al.

[11] Patent Number: 5,316,698
[45] Date of Patent: May 31, 1994

[54] COPPER PASTE FOR INTERNAL CONDUCTOR OF MULTILAYER CERAMIC ELECTRONIC COMPONENT

[75] Inventors: Hiroji Tani; Kazuhito Ohshita, both of Kyoto, Japan

[73] Assignee: Murata Manufacturing Co., Ltd., Japan

[21] Appl. No.: 2,620

[22] Filed: Jan. 11, 1993

[30] Foreign Application Priority Data

Jan. 9, 1992 [JP] Japan ................... 4-21919

[51] Int. Cl.$^5$ .................... H01B 1/00; H01B 1/02
[52] U.S. Cl. .................... 252/512; 252/518; 106/1.18; 106/1.23
[58] Field of Search ............. 252/512, 518; 106/1.18, 106/1.23

[56] References Cited

U.S. PATENT DOCUMENTS 5,035,837   7/1991   Saeki et al. ................... 252/512

Primary Examiner—Linda Skaling
Assistant Examiner—Mark Kopec
Attorney, Agent, or Firm—Ostrolenk, Faber, Gerb & Soffen

[57] ABSTRACT

Copper paste containing copper powder having a mean particle size of 0.5 to 2 μm and a particle size range of 0.3 to 4 μm an organic vehicle and a solvent, the paste including 40 to 60 percent by weight copper powder is applied onto ceramic green sheets in a thickness of 1 to 3 μm, for forming internal conductors of a multilayer ceramic electronic component, such as a multilayer ceramic capacitor. The ceramic green sheets provided with such copper paste films are stacked and fired so that occurrence of voids in the laminate and deformation of the laminate are suppressed in the resulting multilayer ceramic electronic component.

5 Claims, 2 Drawing Sheets

COPPER PASTE FOR INTERNAL CONDUCTOR OF MULTILAYER CERAMIC ELECTRONIC COMPONENT

BACKGROUND OF THE INVENTION

Field of the Invention

The present invention relates to copper paste for an internal conductor of a multilayer ceramic electronic component such as a multilayer ceramic capacitor or a multilayer circuit board.

Description of the Related Art

FIG. 3 is a sectional view showing a conventional multilayer ceramic capacitor 1. This multilayer ceramic capacitor 1 comprises a laminate 5, which is obtained by alternately stacking numerous ceramic layers 2 and numerous internal electrodes 3 and 4. This laminate 5 is provided with external electrodes 6 and 7 on its end surfaces respectively. The internal electrodes 3 extend toward the left end surface of the laminate 5 appearing in FIG. 3, and are electrically connected with the external electrode 6 on this end surface. On the other hand, the internal electrodes 4 extend toward the right end surface of the laminate 5 appearing in FIG. 3, and are electrically connected with the external electrode 7 on this end surface. These internal electrodes 3 and 4 are alternately arranged.

In relation to the aforementioned multilayer ceramic capacitor 1, an attempt has been made to employ copper as a metal for forming the internal electrodes 3 and 4 and the external electrodes 6 and 7, in order to reduce the cost of the capacitor. In this case, at least the internal electrodes 3 and 4 must be cofired with the ceramic material contained in the ceramic layers 2. Such a cofiring step must be carried out in a reducing or neutral atmosphere, in order to prevent oxidation of the copper contained in the internal electrodes 3 and 4. Further, the ceramic layers 2 must contain a nonreducing ceramic material, so that the ceramic material is not reduced by the cofiring step carried out in such an atmosphere.

In order to manufacture the aforementioned multilayer ceramic capacitor 1, containing copper, a plurality of ceramic green sheets are prepared and copper paste is printed on specific ones of such ceramic green sheets for forming the internal electrodes 3 or 4. Then the ceramic green sheets are stacked and pressed to each other, and then cut into proper dimensions to provide a green laminate for forming the laminate 5. Then, copper paste is applied to both end surfaces of this green laminate, to form the external electrodes 6 and 7, respectively. Then the ceramic material and the copper paste contained in the resulting structure are cofired in a reducing or neutral atmosphere such as a nitrogen atmosphere, for example.

The multilayer ceramic capacitor 1 is obtained in the aforementioned manner.

The aforementioned copper paste contains copper powder in addition to an organic vehicle and a solvent.

In the aforementioned multilayer ceramic capacitor 1, it is desirable to increase electrostatic capacitance and achieve miniaturization. In a multilayer circuit board, high densification is also required. In order to satisfy such requirements, it is necessary to reduce the ceramic layers 2 in thickness and increase the number of internal electrodes of 3 and 4.

When the cofiring step is carried out in a nonoxidizing atmosphere as hereinabove described, the organic vehicle contained in the copper paste 10 is undesirably removed causing insufficient binding. In the cofiring stage, therefore, voids 8 are created between the ceramic layers 2 and the internal electrodes 3 or 4, or in the internal electrodes 3 or 4 as shown in FIG. 4. These voids remain in the multilayer ceramic capacitor 1. This leads to deterioration of the multilayer ceramic capacitor 1.

Further, the material of the ceramic layers 2 is substantially different shrinkage factor from that of the material of the internal electrodes 3 and 4 and the external electrodes 6 and 7. Thus, the internal electrodes 3 and 4 and the external electrodes 6 and 7 tend to warp after the cofiring step. This results in structural defects wherein the internal electrodes 3 and 4 are parted, the internal electrodes 3 and 4 are improperly connected with the external electrodes 6 and 7, and the laminate 5 itself is deformed.

SUMMARY OF THE INVENTION

Accordingly, an object of the present invention is to provide copper paste for an internal conductor of a multilayer ceramic electronic component, which can suppress occurrence of the aforementioned voids and structural defects.

Another object of the present invention is to provide a method of manufacturing a multilayer ceramic electronic component using the aforementioned copper paste.

The copper paste according to the present invention contains copper powder having a mean particle size of 0.5 to 2 $\mu$m and a particle size range of 0.3 to 4 $\mu$m, an organic vehicle, and a solvent. The copper powder is 40 to 60 percent by weight of the paste.

In order to manufacture a multilayer ceramic electronic component using such copper paste, numerous ceramic green sheets are prepared and the aforementioned copper paste is applied onto one or more sheets selected from the ceramic green sheets to form a copper paste film of 1 to 3 $\mu$m in thickness. Then the ceramic green sheets are so stacked as to locate the copper paste film between the same, and the as-formed laminate of the ceramic green sheets is then fired.

In the aforementioned manufacturing method, the ceramic green sheets preferably contain a nonreducing ceramic material, and the firing step is carried out in a reducing or neutral atmosphere. Prior to the firing step, copper paste for forming an external conductor may be applied to the outer surface of the laminate, so that not only the copper paste for forming an internal conductor but that for forming an external conductor are cofired with the ceramic material.

When the copper paste according to the present invention is employed for forming a copper paste film for an internal conductor having a thickness of 1 to 3 $\mu$m, removal of the organic vehicle from the copper paste, during step of cofiring the copper, paste film with the ceramic material is reduced and formation of voids is suppressed. Moreover, when the thickness of the internal conductor is in the aforementioned range, this internal conductor hardly warps after the firing step. Consequently, it is possible to suppress occurrence of the aforementioned structural defects. If the thickness of the copper paste film exceeds 3 $\mu$m, this leads to voids and structural defects. If the thickness of the copper paste film is less than 1 $\mu$m, on the other hand, contact between the internal and external conductors is not sufficiently stable and the resulting multilayer ceramic electronic component is insufficient in reliability.

When the mean particle size, the particle size range and the content of the copper powder contained in the copper paste are selected in the aforementioned ranges, a copper paste film of 1 to 3 μm in thickness can be easily obtained by printing. If the amount of copper powder in the paste is less than 40 percent by weight, it is impossible to form with good reproducibility a copper paste film having desired thickness and area by printing. If the amount of the copper powder in the paste exceeds 60 percent by weight, on the other hand, it is difficult to form the copper paste film in a thickness of not more than 3 μm, and this leads to occurrence of voids.

Thus, according to the present invention, it is possible to improve the occupied area and interconnection density of the internal conductor with respect to a single ceramic layer, while increasing the number of layers of such internal conductors without increasing the thickness of the overall laminate. As the result, it is possible to increase electrostatic capacitance provided by the multilayer ceramic electronic component, while improving the degree of freedom in design within prescribed dimensions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
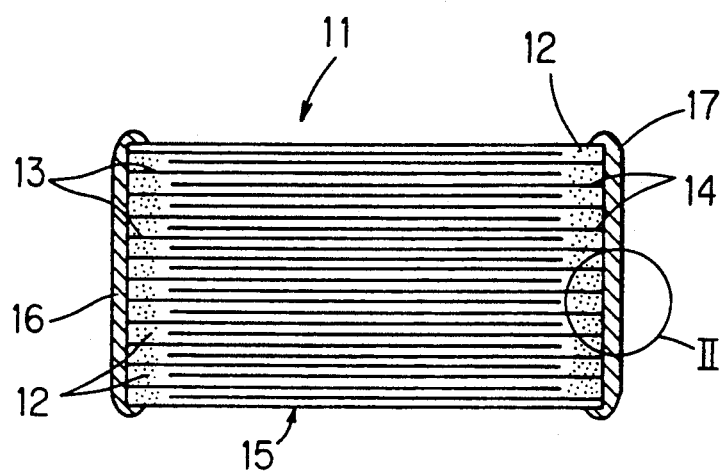
FIG. 1 is a sectional view showing a multilayer ceramic capacitor according to an embodiment of the present invention.
Figure 3:
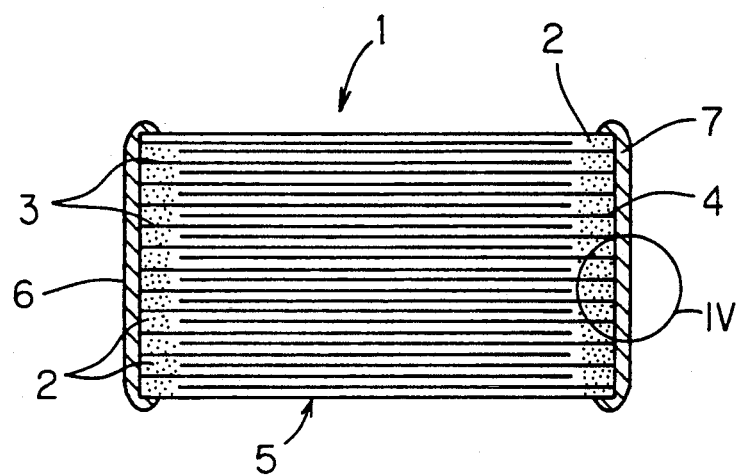
FIG. 3 is a sectional view showing a conventional multilayer ceramic capacitor.
Figure 4:
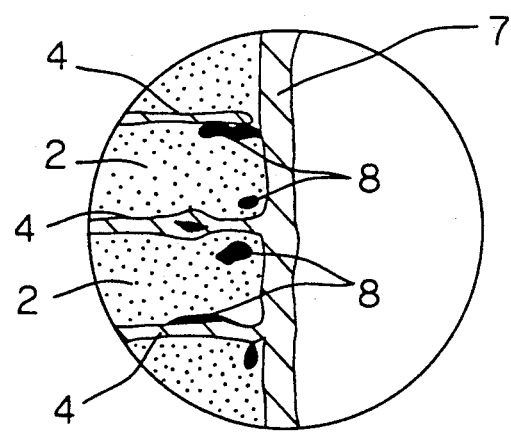
FIG. 4 is an enlarged sectional view showing a part IV appearing in FIG. 3.

Referring to FIG. 1, a multilayer ceramic capacitor 11 according to an embodiment of the present invention is substantially similar in structure to the conventional multilayer ceramic capacitor 1 shown in FIG. 3. This multilayer ceramic capacitor 11 comprises a laminate 15 having a structure obtained by alternately stacking numerous ceramic layers 12 and numerous internal electrodes 13 and 14. This laminate 15 is provided with external electrodes 16 and 17 on its end surfaces respectively. The internal electrodes 13 extend to the left end surface of the laminate 15 appearing in FIG. 1, and are electrically connected to the external electrode 16 on this end surface. On the other hand, the internal electrodes 14 extend to the right end surface of the laminate 15 appearing in FIG. 1, and are electrically connected with the external electrode 17 on this end surface. These internal electrodes 13 and 14 are alternately arranged in the laminate 15.

In order to manufacture such a multilayer ceramic capacitor 11, numerous ceramic green sheets containing a nonreducing ceramic material are prepared and copper paste containing 40 to 60 percent by weight copper powder having a mean particle size of 0.5 to 2 μm and a particle size range of 0.3 to 4 μm, an organic vehicle, and a solvent is also prepared. The aforementioned copper paste is employed to form copper paste films having a thickness of 1 to 3 μm by printing to form the internal electrodes 13 or 14 on selected ceramic green sheets to form the ceramic layers 12.

Then, the ceramic green sheets are stacked to locate the copper paste films therebetween, pressed to each other and cut into desired dimensions. Copper paste for external electrodes 16 and 17 is applied onto the end surfaces of the resulting laminate chip. This copper paste may be identical to or different from that for forming the internal electrodes 13 and 14. Then the aforementioned laminate chip is fired in a reducing or neutral atmosphere. Thus, the multilayer ceramic capacitor 11 is obtained.

An experimental example according to the present invention is now described.

First, a ceramic material of $BaO-Al_2O_3-SiO_2$ system was prepared, and its slurry was formed by a doctor blade coater, to provide ceramic green sheets.

On the other hand, organic vehicles of ethylcellulose resin and terpineol solvents were added to copper powder materials having mean particle sizes shown in Table 1 and mixed with each other so that the copper powder materials attained contents shown in Table 1. These copper powder materials were kneaded in a kneading machine having 3 rolling mills, to obtain copper paste materials for forming internal electrodes.

Then, the copper paste materials were applied onto ceramic green sheets by screen printing in thicknesses shown in Table 1, to form copper paste films for the internal electrodes. Then, ceramic green sheets including those provided with such copper paste films were stacked, pressed to each other and cut to obtain laminate chips of prescribed dimensions. Thereafter the same copper paste materials as those for the internal electrodes were printed on end surfaces of the laminate chips for forming external electrodes. Thereafter the laminate chips were fired in a nitrogen atmosphere at a temperature of 970 for 1 hour.

Void occurrence and chip deformation were observed in the respective samples obtained in the aforementioned manner. Table 1 shows the results.

TABLE 1

|  | Thickness of Copper Paste Film (μm) | Content of Copper Powder in copper Paste (wt. %) | Mean Particle Size of Copper Powder (μm) | Content of Organic Vehicle and Solvent (wt. %) | Void Occurrence | Chip Deformation |
| --- | --- | --- | --- | --- | --- | --- |
| Inventive Sample 1 | 1.0 | 40 | 0.5 | 60 | No | No |
| Inventive Sample 2 | 1.5 | 50 | 1 | 50 | No | No |
| Inventive Sample 3 | 2.4 | 60 | 1 | 40 | No | No |
| Comparative Sample 1 | 3.8 | 70 | 1 | 30 | Yes | Yes |

TABLE 1-continued

| | Thickness of Copper Paste Film (μm) | Content of Copper Powder in copper Paste (wt. %) | Mean Particle Size of Copper Powder (μm) | Content of Organic Vehicle and Solvent (wt. %) | Void Occurrence | Chip Deformation |
|---|---|---|---|---|---|---|
| Comparative Sample 2 | 6.0 | 80 | 1 | 20 | Yes | Yes |
| Comparative Sample 3 | 7.2 | 80 | 3 | 20 | Yes | Yes |
| Comparative Sample 4 | 4.5 | 50 | 3 | 50 | Yes | Yes |
| Comparative Sample 5 | 0.7 | 50 | 0.3 | 50 | No | No |

As understood from Table 1, the thicknesses of the copper paste films and the copper powder contents in the copper paste materials were out of the scope of the present invention in comparative samples 1 to 3, which exhibited occurrence of voids and deformation of the chips. In comparative sample 4, the thickness of the copper paste film and the mean particle size of the copper powder were out of the scope of the present invention, and hence occurrence of voids and deformation of the chip were recognized similarly to comparative samples 1 to 3. In comparative sample 5, the thickness of the copper paste film and the mean particle size of the copper powder were out of the scope of the present invention, and hence this sample was inferior in connection reliability between internal and external electrodes due to the insufficient thickness of the copper film, although neither void occurrence nor chip deformation was recognized.

Figure 2:
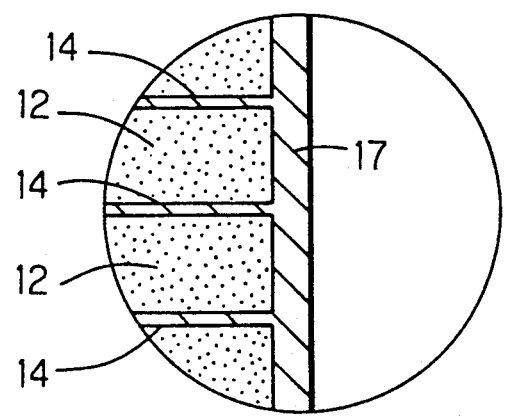
FIG. 2 is an enlarged sectional view showing a part II appearing in FIG. 1.

On the other hand, inventive samples 1 to 3 exhibited neither void occurrence nor chip deformation. Further, no structural defects were recognized as shown in FIG. 2.

The present invention is not restricted to the aforementioned multilayer ceramic capacitor, but is applicable to all types of multilayer ceramic electronic components including a ceramic multilayer circuit board, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. Copper paste for an internal conductor of a multilayer ceramic electronic component, comprising copper powder having a mean particle size of 0.5 to 2 μm and particle size range of 0.3 to 4 μm, an organic vehicle and a solvent, said copper powder being 40 to 60 percent by weight of said copper paste and said organic vehicle and solvent being 60 to 40 percent by weight of said copper paste.

2. Copper paste according to claim 1 in which the copper powder means particle size is 0.5 to 1 μm.

3. Copper paste according to claim 1 in which said organic vehicle and solvent are ethyl cellulose and terpineol.

4. Copper paste according to claim 1 consisting essentially of said copper powder, organic vehicle and solvent.

5. Copper paste according to claim 1 consisting of said copper powder, organic vehicle and solvent.

* * * * *